(12) United States Patent
Akaishi et al.

(10) Patent No.: US 11,148,546 B2
(45) Date of Patent: Oct. 19, 2021

(54) POWER SUPPLY CONTROL DEVICE

(71) Applicant: TOYOTA JIDOSHA KABUSHIKI KAISHA, Toyota (JP)

(72) Inventors: Takayuki Akaishi, Toyota (JP); Sunao Horitake, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 208 days.

(21) Appl. No.: 16/432,993

(22) Filed: Jun. 6, 2019

(65) Prior Publication Data

US 2020/0047634 A1 Feb. 13, 2020

(30) Foreign Application Priority Data

Aug. 7, 2018 (JP) .............................. JP2018-148822
Dec. 4, 2018 (JP) .............................. JP2018-227074

(51) Int. Cl.
*B60L 53/62* (2019.01)
*B60L 53/53* (2019.01)
*G01R 31/387* (2019.01)
*B60L 58/12* (2019.01)
*H02J 7/34* (2006.01)

(52) U.S. Cl.
CPC .............. *B60L 53/62* (2019.02); *B60L 53/53* (2019.02); *B60L 58/12* (2019.02); *G01R 31/387* (2019.01); *H02J 7/342* (2020.01); *B60Y 2300/91* (2013.01)

(58) Field of Classification Search
CPC .......... B60L 53/62; B60L 53/53; B60L 58/12; B60L 3/12; B60L 2240/549; B60L 2240/547; B60L 2240/545; B60L 58/20; B60L 2240/80; B60L 3/0038; H02J 7/342; H02J 7/1423; G01R 31/387;
(Continued)

(56) References Cited

U.S. PATENT DOCUMENTS 7,771,856 B2 * 8/2010 Yoshida ............ H01M 8/04228
429/432
8,395,355 B2 * 3/2013 Kaita ...................... B60L 58/15
320/134

(Continued)

FOREIGN PATENT DOCUMENTS

JP          3879598 B2 *  2/2007 ............. Y02E 60/10
JP       2013-053943 A    3/2013
(Continued)

*Primary Examiner* — M Baye Diao
(74) *Attorney, Agent, or Firm* — Oliff PLC

(57) ABSTRACT

A power supply control device that estimates a full charge capacity of a battery includes a determination unit that determines whether there is a need to correct a currently estimated full charge capacity when a state of charge of the battery is equal to or greater than a first predetermined value at a timing at which a power supply of the vehicle is turned OFF, a power transfer unit that transfers a predetermined power from the battery to another battery when the determination unit determines that there is a need to correct the currently estimated full charge capacity, and a capacity estimation unit that performs a predetermined full charge capacity estimating process on the battery at a timing at which the power supply of the vehicle is turned ON after power transfer by the power transfer unit or during the power transfer by the power transfer unit.

9 Claims, 11 Drawing Sheets

(58) Field of Classification Search
CPC ............ G01R 31/3828; G01R 31/3648; B60Y
2300/91; Y02T 90/12; Y02T 10/7072;
Y02T 10/70
USPC ......................................................... 320/104
See application file for complete search history.

(56) References Cited

U.S. PATENT DOCUMENTS

| | | | |
|---|---|---|---|
| 9,000,730 B2* | 4/2015 | Murawaka | .............. B60L 53/64 |
| | | | 320/133 |
| 9,919,710 B2* | 3/2018 | Murata | ............... B60W 30/192 |
| 10,641,227 B2* | 5/2020 | Namiki | ............... F02N 11/0825 |
| 10,784,697 B2* | 9/2020 | Koishi | ...................... H02J 7/14 |
| 10,894,484 B2* | 1/2021 | Han | ...................... B60L 3/0046 |
| 2014/0163853 A1 | 6/2014 | Mousseau et al. | |
| 2017/0274794 A1* | 9/2017 | Tenmyo | ............... G01R 31/367 |

FOREIGN PATENT DOCUMENTS

| | | | | |
|---|---|---|---|---|
| JP | 2013-101072 A | 5/2013 | | |
| WO | WO-2015044460 A1 * | 4/2015 | ........... | G01R 31/367 |
| WO | WO-2019239706 A1 * | 12/2019 | ............. | G06Q 50/06 |

\* cited by examiner

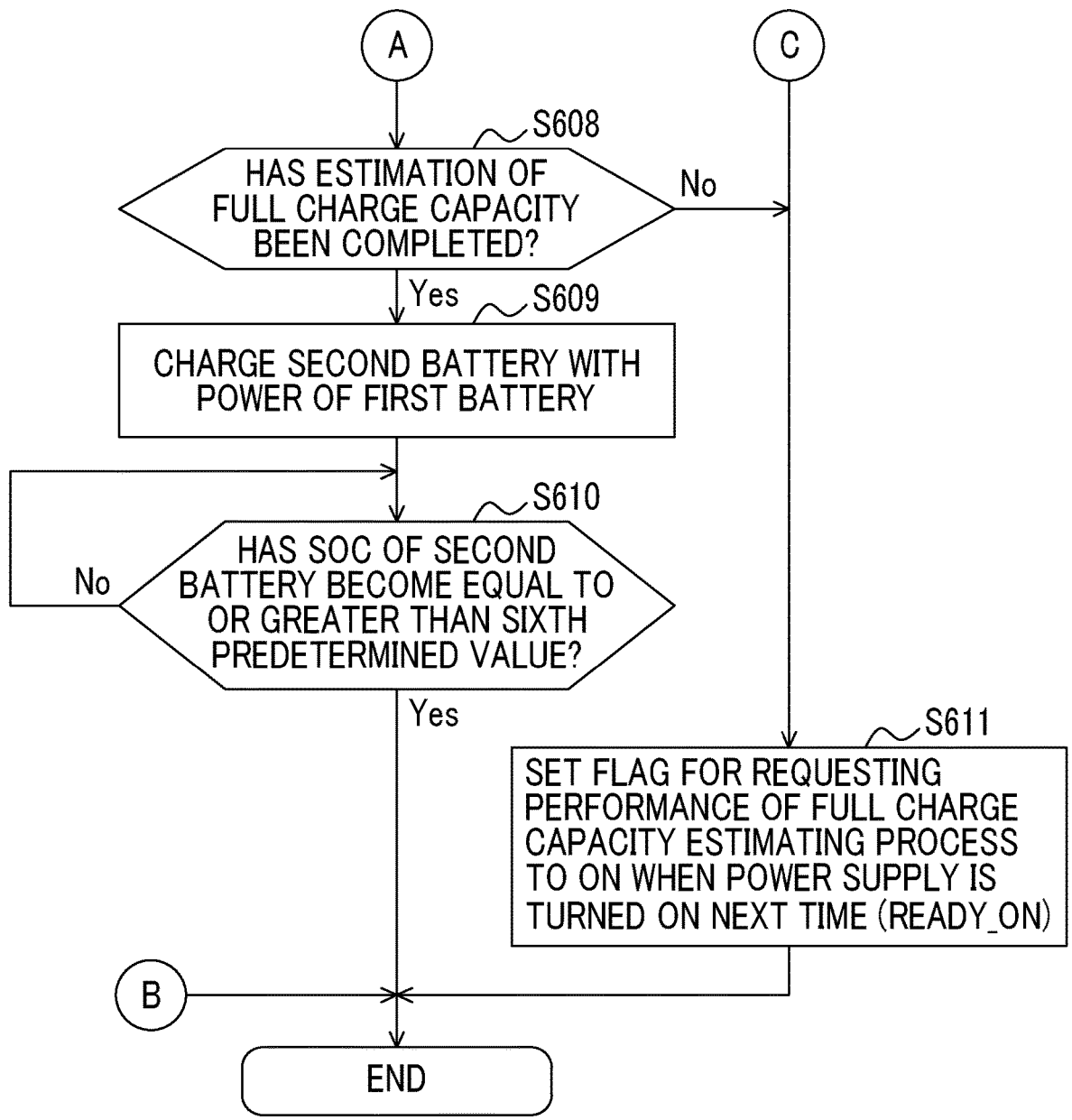

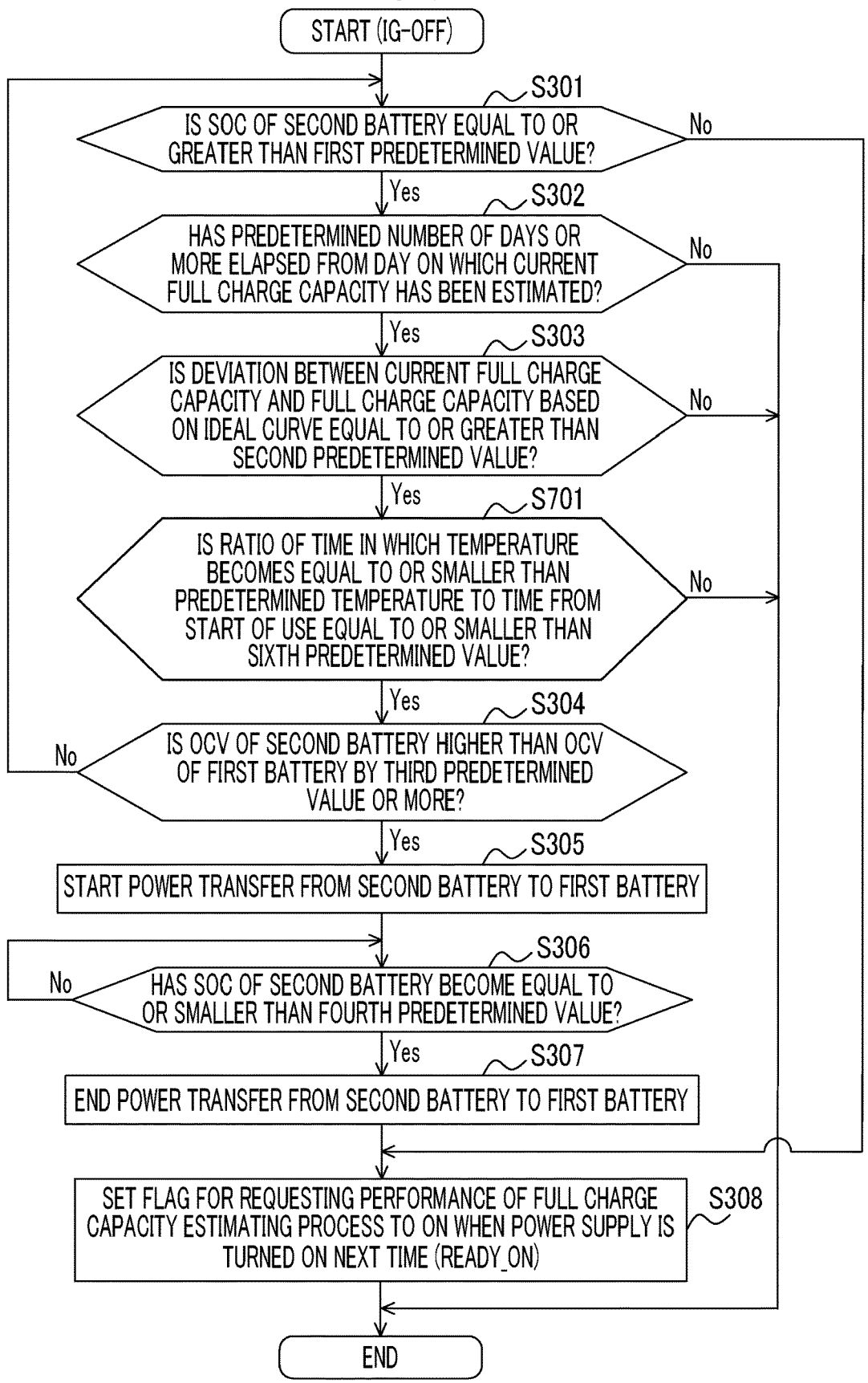

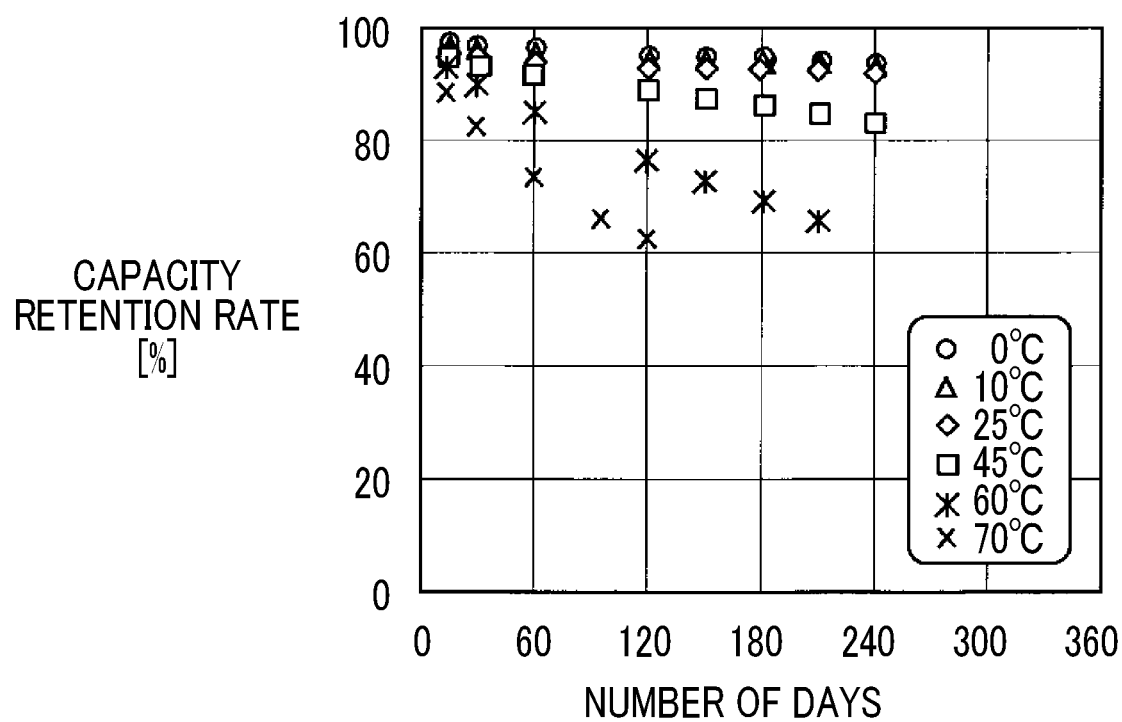

| B TEMPERATURE [°C] | $Tb_1$ | $Tb_2$ | $Tb_3$ | ... | $Tb_{n-1}$ | $Tb_n$ |
|---|---|---|---|---|---|---|
| PRESENCE TIME [min] | $t_1$ | $t_2$ | $t_3$ | ... | $t_{n-1}$ | $t_n$ |

| B TEMPERATURE [°C] | $Tb_1$ | $Tb_2$ | $Tb_3$ | ... | $Tb_{n-1}$ | $Tb_n$ |
|---|---|---|---|---|---|---|
| PRESENCE FREQUENCY [%] | $p_1$ | $p_2$ | $p_3$ | ... | $p_{n-1}$ | $p_n$ |

POWER SUPPLY CONTROL DEVICE

INCORPORATION BY REFERENCE

The disclosure of Japanese Patent Application No. 2018-227074 filed on Dec. 4, 2018 including the specification, drawings and abstract is incorporated herein by reference in its entirety.

BACKGROUND

1. Technical Field

The present disclosure relates to a power supply control device that estimates a full charge capacity of a battery mounted in a vehicle.

2. Description of Related Art

Japanese Unexamined Patent Application Publication No. 2013-101072 (JP 2013-101072 A) discloses a technique for accurately estimating a full charge capacity of a battery. In this technique, each time charging from an external power supply to a vehicle is performed, the full charge capacity of the battery is calculated using a current integration method, and a full charge capacity obtained by adding a previously learned full charge capacity to a currently calculated full charge capacity at a predetermined ratio is learned as a new full charge capacity. Accordingly, it is possible to reduce an influence of a sensor error or a detection error, and to accurately estimate a full charge capacity of the battery.

SUMMARY

In a battery having a flat area in state of charge (SOC)-open circuit voltage (OCV) characteristics (see FIG. 2) such as a lithium iron phosphate battery, it is conceivable to calculate the SOC using a current integration method since it is difficult to settle a state of charge (SOC) from an open circuit voltage (OCV). Here, since a full charge capacity needed for calculating the SOC using the current integration method is a value that changes with the deterioration of a battery, it is desirable to acquire the latest possible value by increasing a frequency at which an estimating process is performed.

However, in a scheme described in JP 2013-101072 A, the full charge capacity estimating process is performed solely at a limited opportunity such as at a timing at which external charging is performed. Further, there is a need to secure a great SOC difference (ΔSOC) before and after charging in order to accurately estimate the full charge capacity, but in the scheme described in JP 2013-101072 A, it is not enough to secure ΔSOC since external charging is performed depending on the situation. Therefore, there is room for improvement on a timing or scheme of performing the full charge capacity estimating process.

The present disclosure provides a power supply control device capable of performing a process of estimating a full charge capacity of a battery at a suitable timing or using a suitable scheme.

An aspect of the present disclosure relates to a power supply control device that estimates a full charge capacity of a battery mounted in a vehicle. The power supply control device includes a determination unit configured to determine whether there is a need to correct a currently estimated full charge capacity when a state of charge of the battery is equal to or greater than a first predetermined value at a timing at which a power supply of the vehicle is turned OFF; a power transfer unit configured to transfer a predetermined power from the battery to another battery when the determination unit determines that there is a need to correct the currently estimated full charge capacity; and a capacity estimation unit configured to perform a predetermined full charge capacity estimating process on the battery at a timing at which the power supply of the vehicle is turned ON after power transfer by the power transfer unit or during the power transfer by the power transfer unit.

In the power supply control device according to the aspect of the present disclosure, the determination unit may be configured to determine whether there is a need to correct the full charge capacity based on whether a predetermined number of days has elapsed from a day on which the full charge capacity of the battery has last been estimated by the capacity estimation unit.

In the power supply control device according to the aspect of the present disclosure, the determination unit may be configured to estimate a deteriorating state of the full charge capacity of the battery and may be configured to determine whether there is a need to correct the full charge capacity based on the estimated deteriorating state.

In the power supply control device according to the aspect of the present disclosure, the determination unit may be configured to estimate the deteriorating state based on whether a deviation between a full charge capacity obtained from a predetermined aged deterioration curve and the full charge capacity estimated by the capacity estimation unit is equal to or greater than a second predetermined value.

In the power supply control device according to the aspect of the present disclosure, the determination unit may be configured to estimate the deteriorating state based on whether a ratio of a time, in which a temperature of the battery becomes equal to or lower than a predetermined temperature, to a time from start of use, which is obtained from predetermined battery temperature information, is equal to or smaller than a sixth predetermined value.

In the power supply control device according to the aspect of the present disclosure, the power transfer unit may be configured to transfer the predetermined power from the battery to the other battery when an open circuit voltage of the battery is higher than an open circuit voltage of the other battery by a third predetermined value or more.

In the power supply control device according to the aspect of the present disclosure, the power transfer unit may be configured to end the power transfer when the state of charge of the battery becomes equal to or smaller than a fourth predetermined value smaller than the first predetermined value or when a current value discharged from the battery becomes equal to or smaller than a fifth predetermined value.

In the power supply control device according to the aspect of the present disclosure, the capacity estimation unit may be configured to perform the full charge capacity estimating process at a timing at which the power supply of the vehicle is turned ON without the determination unit making the determination when the state of charge of the battery is smaller than the first predetermined value.

In the power supply control device according to the aspect of the present disclosure, the power transfer unit may be configured to perform a process of charging the battery with at least a part of the power transferred to the other battery when the estimation of the full charge capacity of the battery is completed due to power transfer.

According to the aspect of the present disclosure, it is possible to perform a process of estimating a full charge capacity of a battery at a suitable timing or using a suitable scheme.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein:

FIG. 6B is a flowchart illustrating a procedure of a process regarding estimation of a full charge capacity of a battery that is performed by a power supply control device according to according to the second embodiment and a fourth embodiment;

FIG. 7 is a flowchart illustrating a procedure of a process regarding estimation of a full charge capacity of a battery that is performed by a power supply control device according to a third embodiment;

FIG. 8 is a diagram illustrating an example of aged deterioration characteristics when an environmental temperature of a battery has been changed;

DETAILED DESCRIPTION OF EMBODIMENTS

Overview

The power supply control device of the present disclosure transfers a power of a battery in which there is a need to correct a full charge capacity to another battery and lowers the power to a predetermined SOC at a timing at which a power supply of a vehicle is turned OFF. The full charge capacity of the battery that is a correction target is calculated using a current integration method using a great SOC width at a timing at which the power supply of the vehicle is turned ON. Accordingly, it is possible to estimate the full charge capacity with high accuracy.

First Embodiment

Configuration

Figure 1:
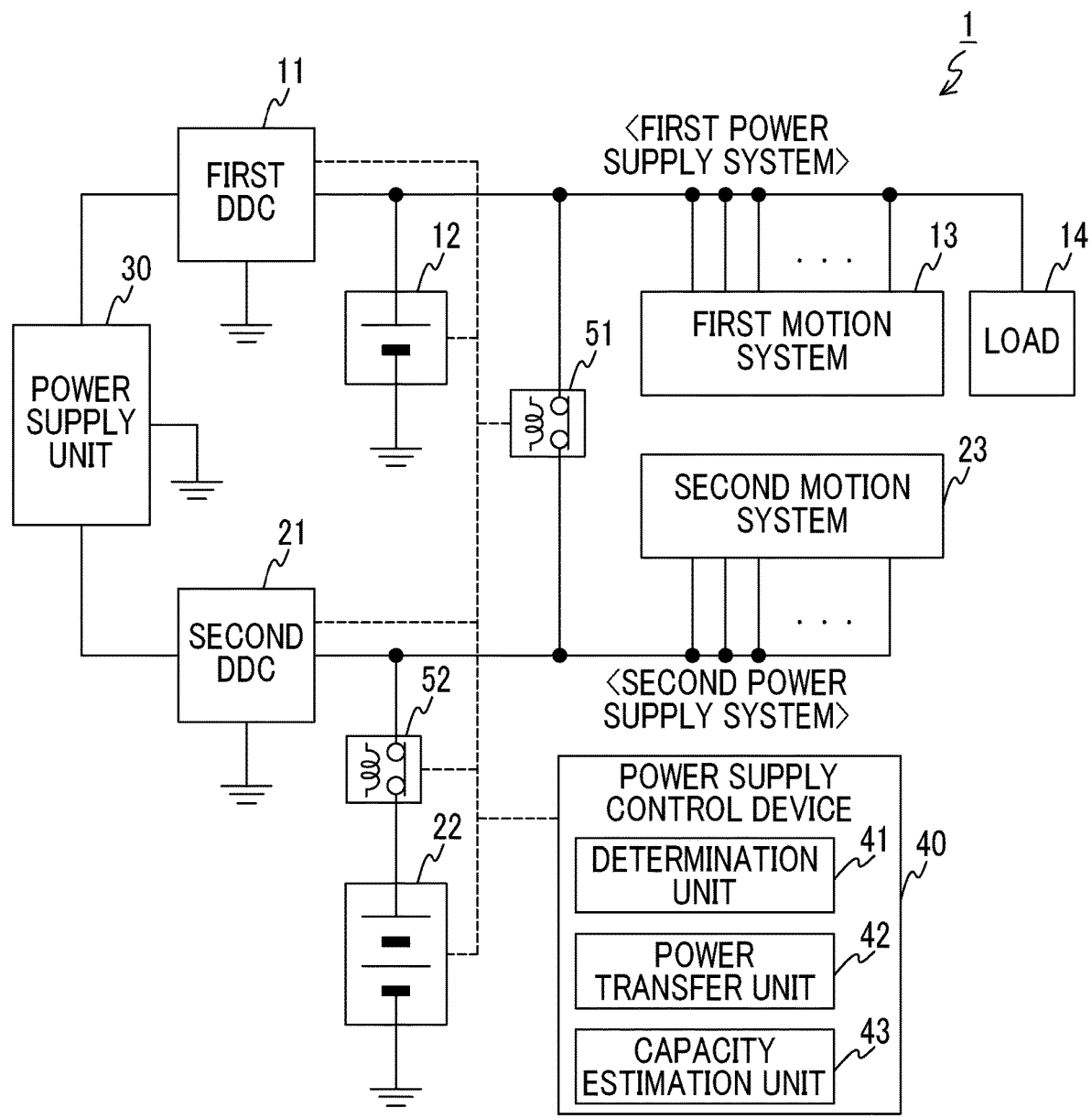
FIG. 1 is a diagram illustrating a schematic configuration example of a power supply system including a power supply control device according to a first embodiment.

FIG. 1 is a diagram illustrating a schematic configuration example of a power supply system 1 for a vehicle including a power supply control device 40 according to a first embodiment of the present disclosure. The power supply system 1 illustrated in FIG. 1 includes a first power supply system including a first DCDC converter (hereinafter referred to as a "first DDC") 11, a first battery 12, a first motion system 13, and a load 14, a second power supply system including a second DCDC converter (hereinafter referred to as a "second DDC") 21, a second battery 22, and a second motion system 23, a power supply unit 30, and a power supply control device 40.

In this power supply system 1, a redundant power supply configuration including the first power supply system and the second power supply system is adopted. The first power supply system and the second power supply system are connected via a first relay device 51 for supplying a dark current. The second battery 22 is connected to the second power supply system via a second relay device 52 for battery protection. Connection/disconnection of the first relay device 51 and the second relay device 52 are controlled by the power supply control device 40.

The power supply unit 30 can supply a power to the first DDC 11 and the second DDC 21 in parallel. For this power supply unit 30, for example, a high voltage battery configured to be chargeable and dischargeable such as a lithium ion battery may be used.

The first DDC 11 converts the power supplied from the power supply unit 30 and outputs the resultant power to the first battery 12, the first motion system 13, and the load 14. Specifically, the first DDC 11 steps down a high voltage power supplied from the power supply unit 30 to a low voltage power and outputs the low voltage power to the first battery 12, the first motion system 13, and the load 14.

The first battery 12 is, for example, a power storage element configured to be chargeable and dischargeable, such as a lead battery. The first battery 12 can store (charge) power output from the first DDC 11, and output (discharge) the power stored in the first battery 12 to the first motion system 13 and the load 14.

The first motion system 13 includes an in-vehicle device related to a motion (running, turning, and stopping) of the vehicle. The first motion system 13 includes, for example, devices for steering, braking, autonomous driving support, and the like.

The load 14 includes one or more in-vehicle devices not related to the motion of the vehicle. The load 14 includes, for example, a device such as a headlamp or a wiper.

The second DDC 21 can convert the power supplied from the power supply unit 30 and output a resultant power to the second battery 22 and the second motion system 23. Specifically, the second DDC 21 steps down a high voltage power supplied from the power supply unit 30 to a low voltage power and outputs the low voltage power to the second battery 22 and the second motion system 23.

Figure 2:
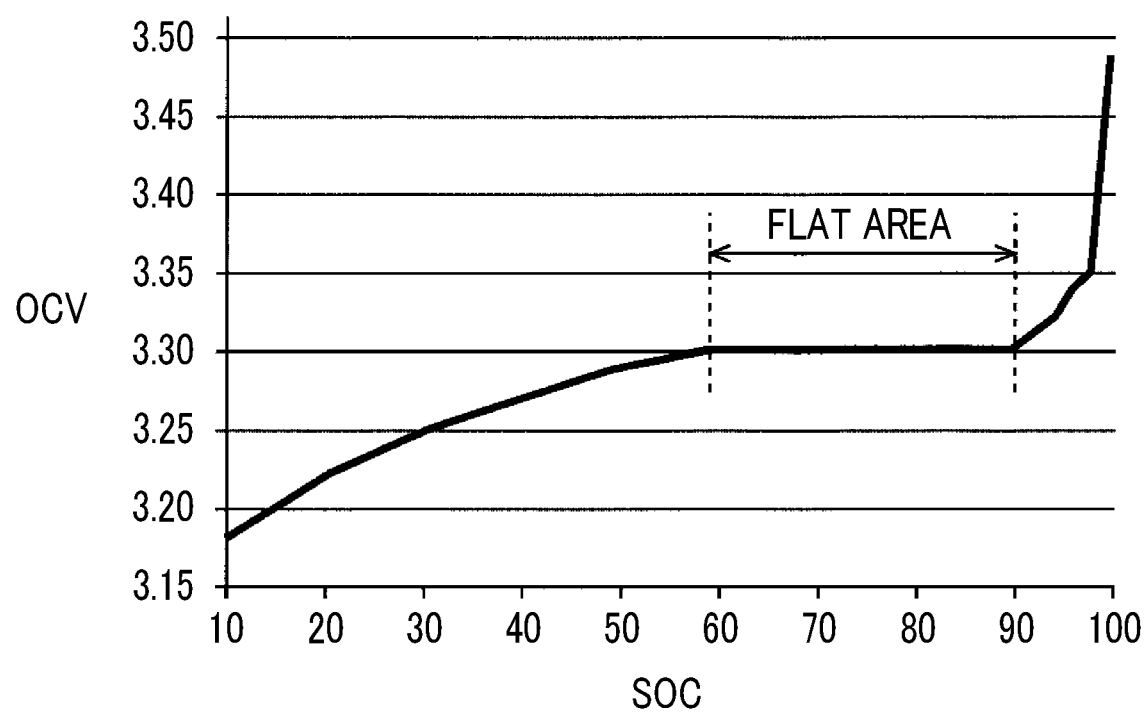
FIG. 2 is a graph illustrating an example of SOC-OCV characteristics of a lithium ion battery.

The second battery 22 is a power storage element configured to be chargeable and dischargeable, for example, a lithium ion battery. In the first embodiment, the second battery 22 is a lithium iron phosphate battery (an LFP (Lithium Iron Phosphate) battery) having a flat area in SOC-OCV characteristics as illustrated in FIG. 2. The second battery 22 can store (charge) power output from the second DDC 21 via the second relay device 52, and can output (discharge) the power stored in second battery 22 to the second motion system 23. The second battery 22 serves as a backup power supply for maintaining functions related to the motion of the vehicle when a failure of the first battery 12 occurs during driving of the vehicle.

The second motion system 23 is a motion system in which the same system as the first motion system 13 is redundantly provided, and includes an in-vehicle device related to a motion of the vehicle, similar to the first motion system 13.

The power supply control device 40 can manage states, operations, and the like of the first DDC 11, the second DDC 21, the first battery 12, the second battery 22, the first relay device 51, and the second relay device 52 to control the state of the power supply system 1. The power supply control device 40 according to the first embodiment executes control for estimating the full charge capacity of the second battery 22 with high accuracy.

The power supply control device 40 includes a determination unit 41, a power transfer unit 42, and a capacity estimation unit 43.

The determination unit 41 determines whether there is a need to correct the currently estimated full charge capacity when the state of charge (SOC) of the second battery 22 is equal to or greater than the first predetermined value. The determination unit 41 can be realized by, for example, a monitoring electronic control unit (ECU) (not illustrated) capable of monitoring a voltage, current, and temperature of the second battery 22 using a sensor or the like.

When the determination unit 41 determines that there is a need to correct the full charge capacity of the second battery 22, the power transfer unit 42 transfers a predetermined power from the second battery 22 to another battery (in the first embodiment, the first battery 12) in which it is not needed to correct the full charge capacity. The power transfer unit 42 can be realized by, for example, a power supply ECU (not illustrated) capable of controlling a connection state of the first relay device 51 and controlling an output voltage of the first DDC 11 or the second DDC 21, or a monitoring ECU (not illustrated) capable of controlling a connection state of the second relay device 52.

The capacity estimation unit 43 performs a predetermined full charge capacity estimating process on the second battery 22 according to a power supply state of the vehicle. The capacity estimation unit 43 can be realized by, for example, a power supply ECU (not illustrated) capable of controlling the output voltage of the second DDC 21.

Detailed control of the determination unit 41, the power transfer unit 42, and the capacity estimation unit 43 will be described below.

Control

Figure 3:
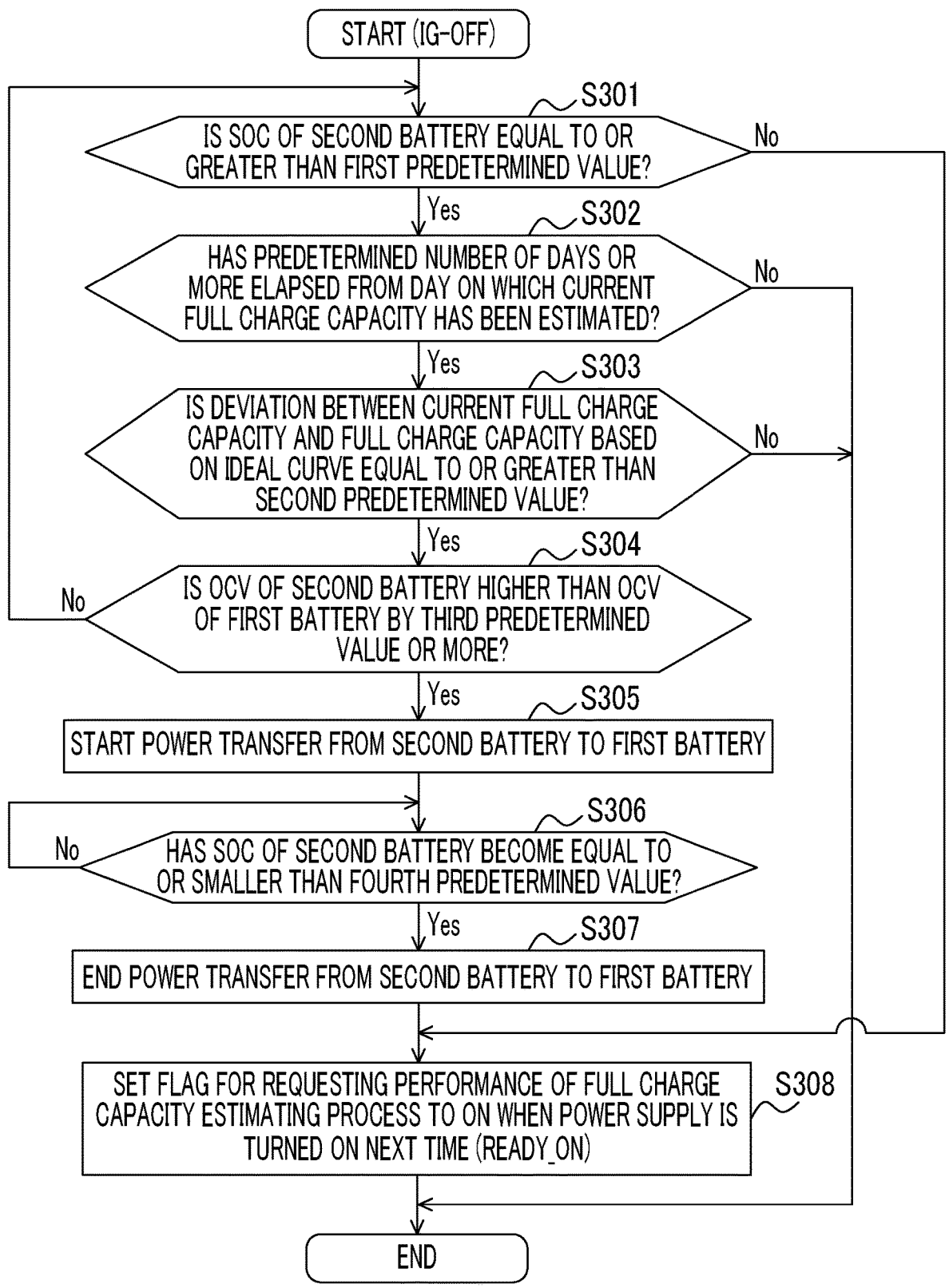
FIG. 3 is a flowchart illustrating a procedure of a process regarding estimation of a full charge capacity of a battery that is performed by a power supply control device according to the first embodiment.
Figure 4A:
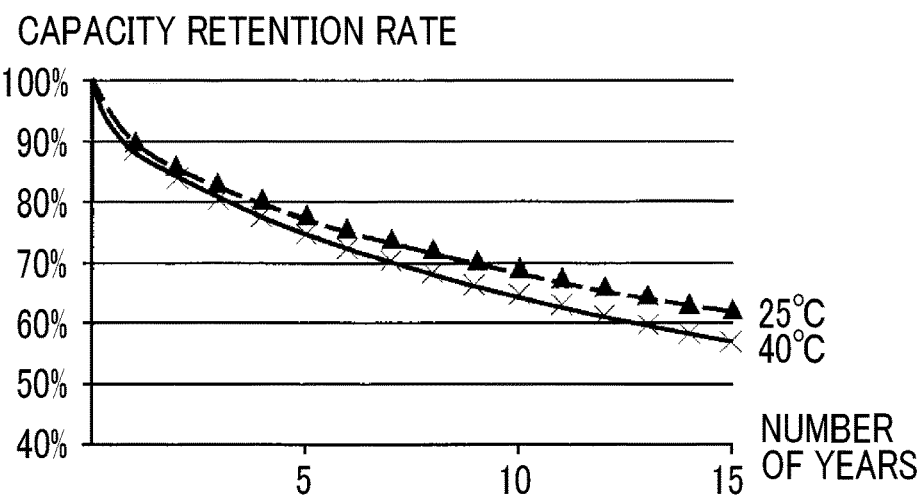
FIG. 4A is a graph illustrating an example of an ideal curve of battery capacity deterioration.
Figure 4B:
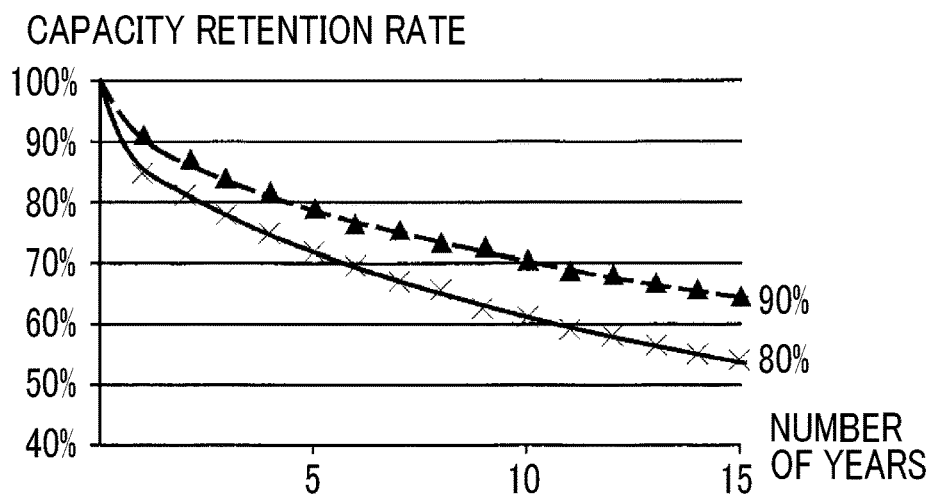
FIG. 4B is a graph illustrating an example of an ideal curve of battery capacity deterioration.
Figure 4C:
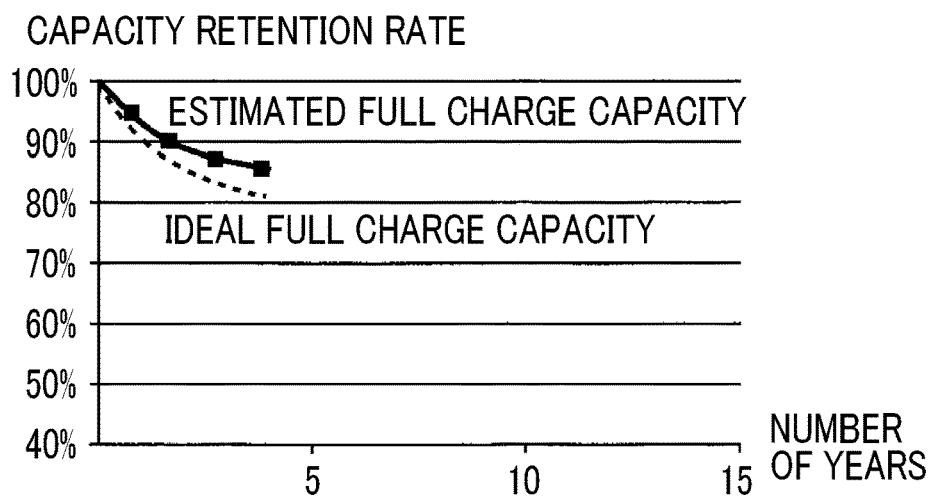
FIG. 4C is a graph illustrating an example of an ideal curve of battery capacity deterioration.

Next, control that is executed by the power supply control device 40 according to the first embodiment of the present disclosure will be described with reference to FIG. 3 and FIGS. 4A to 4C. FIG. 3 is a flowchart illustrating a process related to estimation of a full charge capacity of the second battery 22 that is performed by the power supply control device 40 according to the first embodiment. FIGS. 4A to 4C are graphs illustrating an example of an ideal curve of battery capacity deterioration.

The process illustrated in FIG. 3 is started when the power supply of the vehicle is turned OFF (for example, IG OFF) like the time of parking of the vehicle.

(Step S301) The determination unit 41 determines whether the SOC of the second battery 22 is equal to or greater than a first predetermined value. This determination is made in order to determine whether there is a need to intentionally lower the SOC of the second battery 22 in order to secure ΔSOC which increases estimation accuracy when the full charge capacity estimating process is performed. Therefore, the first predetermined value is set to an SOC with which the ΔSOC needed for estimating the full charge capacity with high accuracy is determined to be able to be secured. In the lithium iron phosphate battery having the SOC-OCV characteristics illustrated in FIG. 2, it is possible to set an SOC lower than the flat area, as the first predetermined value.

When the SOC of the second battery 22 is equal to or greater than the first predetermined value (Yes in S301), the process proceeds to step S302, and when the SOC of the second battery 22 is smaller than the first predetermined value (No in S301), the process proceeds to step S308.

(Step S302) The determination unit 41 determines whether a predetermined number of days or more has elapsed from a day on which a current full charge capacity has been estimated (a last estimating processing date) for the second battery 22. This determination is made to determine whether there is a need to correct (review) the current full charge capacity due to deterioration over time of the second battery 22. For the predetermined number of days, an appropriate value can be optionally determined based on a use environment of the vehicle or the like, but the predetermined number of days can be set to, for example, 30 days.

When a predetermined number of days or more has elapsed from the day on which the current full charge capacity has been estimated (Yes in S302), the process proceeds to step S303, and when the predetermined number of days or more has not elapsed from the date on which the current full charge capacity has been estimated (No in S302), this process ends.

(Step S303) The determination unit 41 estimates a deteriorating state of the full charge capacity of the second battery 22 and determines whether there is a need to correct the current full charge capacity based on the estimated deteriorating state. More specifically, the determination unit 41 determines whether a deviation between the current full charge capacity estimated in the previous process and an ideal full charge capacity is equal to or greater than the second predetermined value. The ideal full charge capacity is a full charge capacity that is calculated from an aged deterioration curve (an ideal curve) of the battery capacity showing a change in a capacity retention rate of the battery (=full charge capacity after deterioration/full charge capacity of a new product) with the number of elapsed years, and an actual state of use of the vehicle.

The ideal curve can be obtained in advance by changing a battery temperature and a SOC level correlated with the deterioration of the battery capacity. For example, FIG. 4A illustrates ideal curves when batteries having the same SOC are left in an environment of a temperature of 25° C. and when the batteries are left in an environment of a temperature of 40° C. FIG. 4B illustrates ideal curves when batteries are left at a state of SOC 90% and when the batteries are left at a state of SOC 80% under the same temperature environment.

The state of use of the vehicle is, for example, a state of a temperature environment to which the battery is actually exposed, or the SOC in which the battery is used. In the vehicle, a history of a temperature environment or the SOC of the battery that changes from moment to moment is stored by using, for example, measured values of various sensors mounted in the vehicle, and an ideal full charge capacity can be calculated based on a use ratio of the temperature environment or the SOC. For example, when a period of exposure to the environment of temperature 25° C. and a period of exposure to an environment of temperature 40° C. have substantially the same ratio (1:1) for four years, it is possible to calculate an intermediate value (four years) of two ideal curves illustrated in FIG. 4A as an ideal full charge capacity.

The determination unit 41 determines whether the ideal full charge capacity calculated using the scheme described above and the current full charge capacity estimated in the previous process deviate from each other by the second predetermined value or more. The second predetermined value may be set to an appropriate value based on, for example, a specification or performance needed for the vehicle. This deviation may be determined solely by a simple difference between the current full charge capacity and the ideal full charge capacity calculated this time or may be determined from a transition of the present full charge capacity at each point in time estimated up to the previous time and a transition of the ideal full charge capacity calculated so far (FIG. 4C). Further, a full charge capacity obtained by resetting a deviation difference obtained this time may be set as the current full charge capacity.

When the deviation between the current full charge capacity and the ideal full charge capacity is equal to or greater than the second predetermined value (Yes in S303), the process proceeds to step S304, and when the deviation between the current full charge capacity and the ideal full charge capacity is not equal to or greater than the second predetermined value (No in S303), this process ends.

(Step S304) The determination unit 41 determines whether an open circuit voltage (OCV) of the second battery 22 is higher than an open circuit voltage (OCV) of the first battery 12 by a third predetermined value or more. This determination is made so that the process of lowering the SOC of the second battery 22 needed for securing ΔSOC can be performed without wastefully discarding the power of the second battery 22. In particular, since this process is assumed to be performed in a state in which the vehicle power supply is turned OFF like the time of parking, the process also serves to recover the SOC of the first battery 12 that has been self-discharged due to long-term parking.

The third predetermined value is set based on whether power transfer from the second battery 22 to the first battery 12 to be described below can be efficiently performed. For example, when there is substantially no voltage difference between the open circuit voltage of the second battery 22 and the open circuit voltage of the first battery 12, substantially no current flows between the batteries. Accordingly, transferred power is also reduced and the SOC of the second battery 22 cannot be efficiently lowered. Therefore, the third predetermined value is set so that a certain voltage difference can be determined. It is desirable for the predetermined value to be set in consideration of voltage drop due to a resistance value of a wiring path (wire harness or the like) from the second battery 22 to the first battery 12.

When the open circuit voltage of the second battery 22 is higher than the open circuit voltage of the first battery 12 by the third predetermined value or more (Yes in S304), the process proceeds to step S305. When the open circuit voltage of the second battery 22 is not higher than the open circuit voltage of the first battery 12 by the third predetermined value or more (No in S304), the process proceeds to step S301.

(Step S305) The power transfer unit 42 starts power transfer from the second battery 22 to the first battery 12. The power transfer unit 42 can start the power transfer by turning ON the second relay device 52 connecting the second battery 22 to the second power supply system or turning ON the first relay device 51 connecting the first power supply system to the second power supply system.

(Step S306) The determination unit 41 determines whether the SOC of the second battery 22 has become equal to or smaller than a fourth predetermined value. This determination is performed in order to determine whether the process of lowering the SOC of the second battery 22 needed for securing ΔSOC has been completed. Therefore, the fourth predetermined value is set to a SOC which is smaller than the first predetermined value and with which the ΔSOC needed for estimating the full charge capacity with high accuracy is determined to have been secured. In the lithium iron phosphate battery having the SOC-OCV characteristics illustrated in FIG. 2, it is possible to set the SOC (for example, 30%) lower than the flat area as the fourth predetermined value.

The determination unit 41 may determine whether a discharge current of the second battery 22 is equal to or lower than a fifth predetermined value, instead of determining whether the SOC of the second battery 22 has become equal to or smaller than the fourth predetermined value. This is because, by looking at the discharge current of the second battery 22, the determination unit 41 can determine that power transfer has been performed when there is no voltage difference between the open circuit voltage of the second battery 22 and the open circuit voltage of the first battery 12, and can indirectly determine that the SOC of the second battery 22 has been lowered to the SOC needed for securing ΔSOC.

When the SOC of the second battery 22 is equal to or lower than the fourth predetermined value (or the discharge current is equal to or smaller than the fifth predetermined value) (Yes in S306), the process proceeds to step S307, and When the SOC of the second battery 22 is not equal to or lower than the fourth predetermined value (or the discharge current is not equal to or smaller than the fifth predetermined value) (No in S306), the process of step S306 is repeatedly executed.

(Step S307) The power transfer unit 42 ends the power transfer from the second battery 22 to the first battery 12. The power transfer unit 42 can end the power transfer by turning OFF the second relay device 52 connecting the second battery 22 to the second power supply system or turning OFF the first relay device 51 connecting the first power supply system to the second power supply system.

(Step S308) When the power supply of the vehicle is turned ON next time (READY_ON, or the like), the determination unit 41 sets a flag for requesting performance of a process of estimating a predetermined full charge capacity to an ON state. The capacity estimation unit 43 confirms this flag when the power supply of the vehicle is turned ON, and when the flag is set to the ON state, the capacity estimation unit 43 performs a process of estimating the full charge capacity of the second battery 22 using the secured ΔSOC with high accuracy. When the capacity estimation unit 43 completes the process of estimating the full charge capacity of the second battery 22, the determination unit 41 sets the flag to the OFF state. The full charge capacity estimating process can be performed using a well-known current integration method in a charging action from a low SOC to a high SOC.

When the power supply of the vehicle is turned ON during the processes of steps S301 to S308 described above, the flag for requesting performance of the full charge capacity estimating process is OFF. Accordingly, the full charge capacity estimating process will not be performed. When the power supply of the vehicle is turned OFF next time, the process of step S301 described above is started again.

Second Embodiment

Configuration

Figure 5:
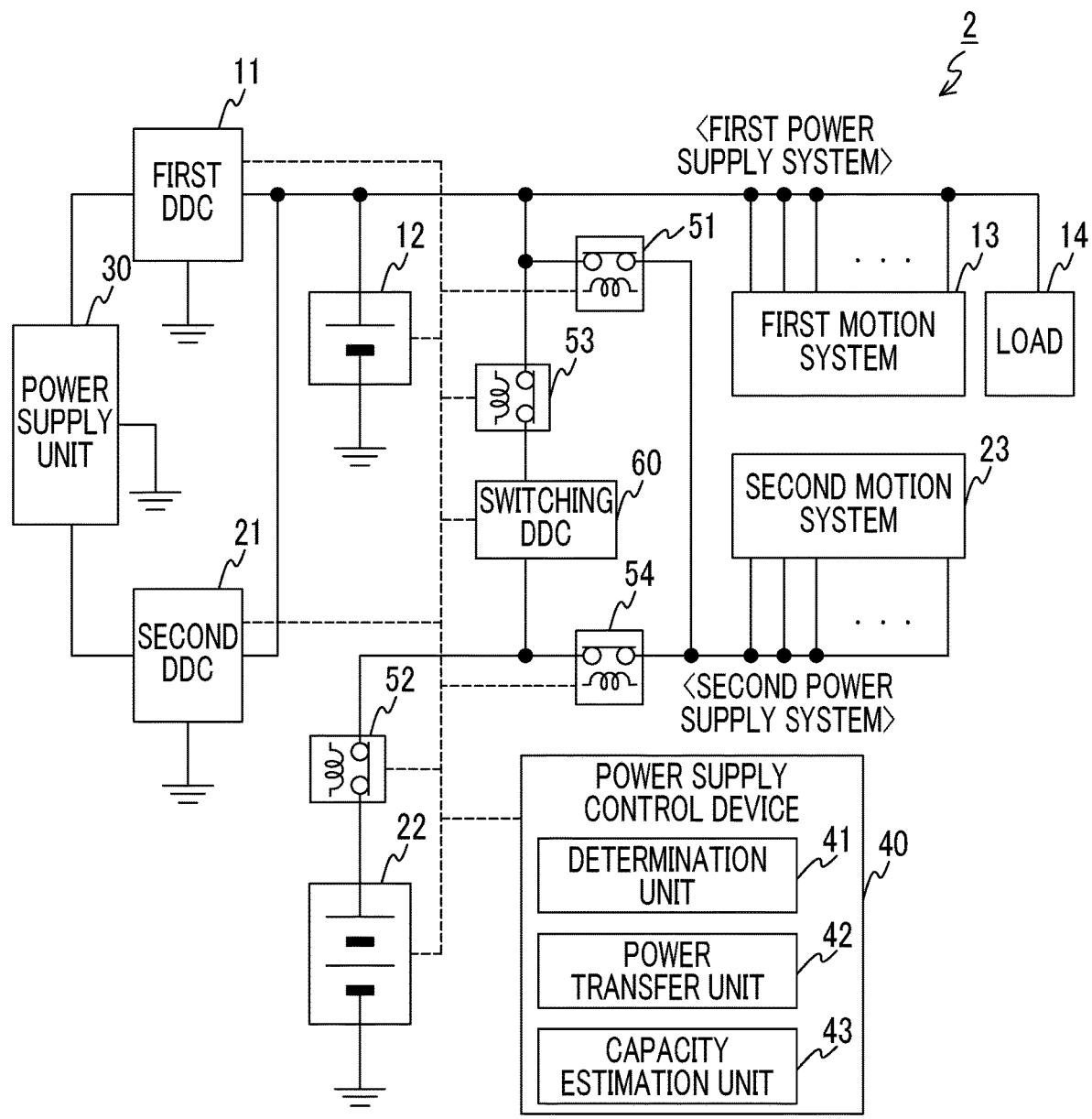
FIG. 5 is a diagram illustrating a schematic configuration example of a power supply system including a power supply control device according to a second embodiment.

FIG. 5 is a diagram illustrating a schematic configuration example of a power supply system 2 for a vehicle including a power supply control device 40 according to a second embodiment of the present disclosure. The power supply system 2 illustrated in FIG. 5 includes a first power supply system including a first DDC 11, a first battery 12, a first motion system 13, and a load 14, a second power supply system including a second DDC 21, a second battery 22, and a second motion system 23, a power supply unit 30, and a power supply control device 40.

In this power supply system 2, a redundant power supply configuration using a first power supply system and a second power supply system is adopted. The first power supply system and the second power supply system are connected to each other via the first relay device 51 for dark current supply. In addition, the first power supply system and the second power supply system are connected to each other via a third relay device 53 and a switching DCDC converter (hereinafter referred to as a "switching DDC") 60. The second battery 22 is connected to the switching DDC 60 via the second relay device 52 for battery protection and connected to the second motion system 23 of the second power supply system via the fourth relay device 54. Connection/disconnection of the first relay device 51, the second relay device 52, the third relay device 53, the fourth relay device 54, and the switching DDC 60 is controlled by the power supply control device 40.

In the configuration of the power supply system 2 of the second embodiment, the power supply unit 30, the first DDC 11, the first motion system 13, the load 14, and the second motion system 23 are the same as those in the power supply system 1 of the first embodiment, and therefore, description thereof will be omitted.

The first battery 12 is, for example, a power storage element configured to be chargeable and dischargeable, such as a lead battery. The first battery 12 can store (charge) power output from the first DDC 11 and power output from the second DDC 21, and output (discharge) the power stored in the first battery 12 to the first motion system 13 and the load 14.

The second DDC 21 converts the power supplied from the power supply unit 30 and outputs the resultant power to the first battery 12, the first motion system 13, and the load 14. Specifically, the second DDC 21 steps down a high voltage power supplied from the power supply unit 30 to a low voltage power and outputs the low voltage power to the first battery 12, the first motion system 13, and the load 14.

The second battery 22 is a power storage element configured to be chargeable and dischargeable, for example, a lithium ion battery. In the second embodiment, the second battery 22 is a lithium iron phosphate battery (an LFP battery) having a flat area in SOC-OCV characteristics as illustrated in FIG. 2. The second battery 22 can output (discharge) the power stored in second battery 22 to the second motion system 23 via the second relay device 52 and the fourth relay device 54. The second battery 22 serves as a backup power supply for maintaining functions related to the motion of the vehicle when a failure of the first battery 12 occurs during driving of the vehicle.

The power supply control device 40 can manage states, operations, or the like of the first DDC 11, the second DDC 21, the first battery 12, the second battery 22, the first relay device 51, the second relay device 52, the third relay device 53, the fourth relay device 54, and the switching DDC 60 to control the state of the power supply system 2. The power supply control device 40 according to the second embodiment executes control for estimating the full charge capacity of the second battery 22 with high accuracy.

The power supply control device 40 includes a determination unit 41, a power transfer unit 42, and a capacity estimation unit 43.

The determination unit 41 determines whether there is a need to correct the currently estimated full charge capacity when the state of charge (SOC) of the second battery 22 is equal to or greater than the first predetermined value. The determination unit 41 can be realized by, for example, a monitoring ECU (not illustrated) capable of monitoring a voltage, current, and temperature of the second battery 22 using a sensor or the like.

When the determination unit 41 determines that there is a need to correct the full charge capacity of the second battery 22, the power transfer unit 42 transfers a predetermined power from the second battery 22 to another battery (in the second embodiment, the first battery 12) in which it is not needed to correct the full charge capacity. In addition, the power transfer unit 42 can also perform charging by causing the power to return from the first battery 12 to the second battery during this power transfer. The power transfer unit 42 can be realized by, for example, a power supply ECU (not illustrated) capable of controlling a connection state of the first relay device 51, the third relay device 53, the fourth relay device 54, and the switching DCDC converter 60, or a monitoring ECU (not illustrated) capable of controlling a connection state of the second relay device 52.

The capacity estimation unit 43 performs a predetermined full charge capacity estimating process on the second battery 22 according to a power supply state of the vehicle. The capacity estimation unit 43 can be realized by, for example, a power supply ECU (not illustrated) capable of controlling the output voltage of the switching DDC 60.

Detailed control of the determination unit 41, the power transfer unit 42, and the capacity estimation unit 43 will be described below.

Control

Figure 6A:
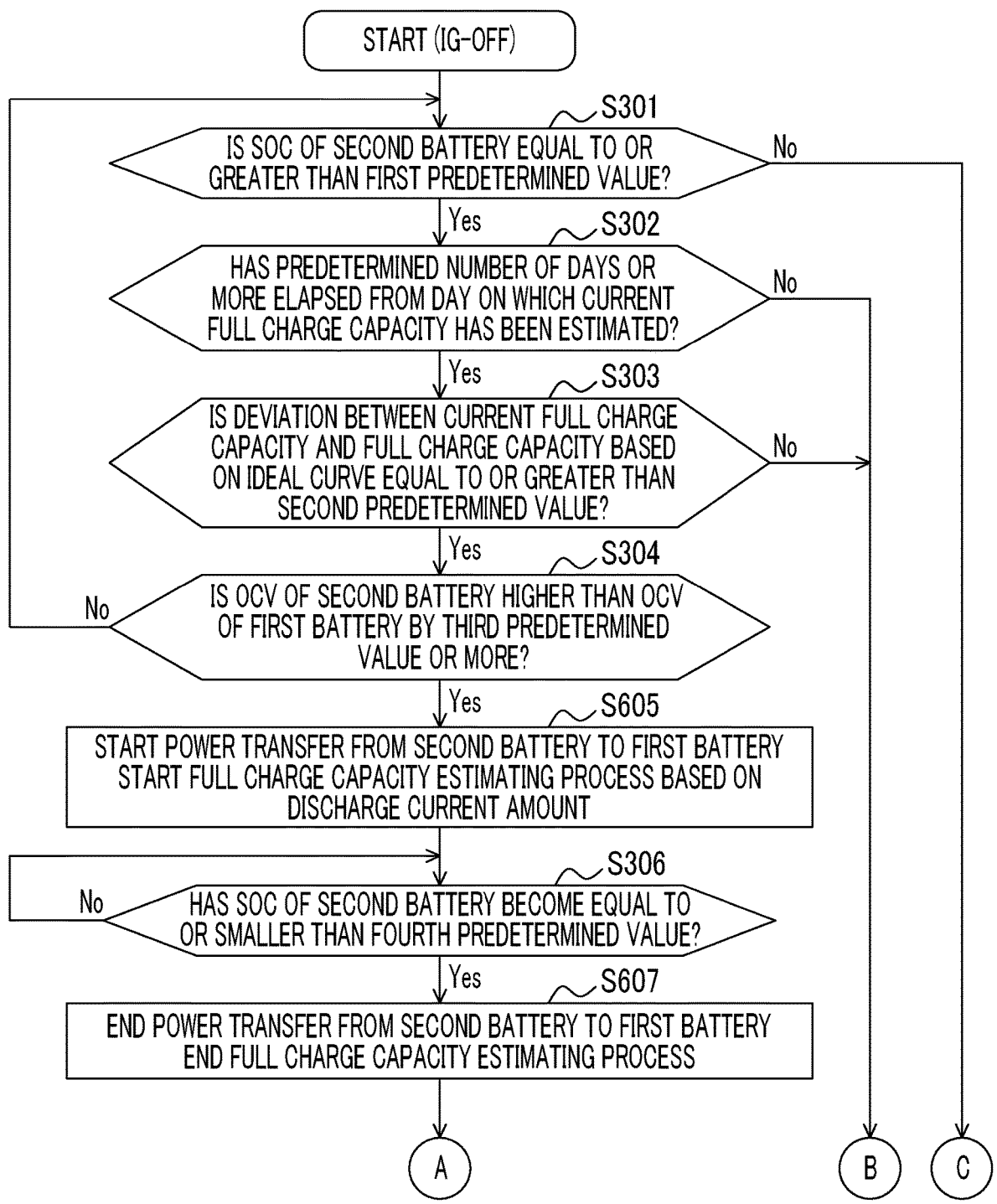
FIG. 6A is a flowchart illustrating a procedure of a process regarding estimation of a full charge capacity of a battery that is performed by a power supply control device according to a second embodiment.

Next, control that is executed by the power supply control device 40 according to the second embodiment of the present disclosure will be described with reference to FIGS. 6A and 6B. FIGS. 6A and 6B are flowcharts illustrating a process related to estimation of a full charge capacity of the second battery 22 that is performed by the power supply control device 40 according to the second embodiment. Among the steps illustrated in FIGS. 6A and 6B in the second embodiment, the step of performing the same process as the step illustrated in FIG. 3 in the first embodiment is denoted by the same reference numeral and description thereof will be omitted.

(Step S605) When a determination is made in step S304 that the open circuit voltage of the second battery 22 is greater than the open circuit voltage of the first battery 12 by the third predetermined value or more, the power transfer unit 42 starts power transfer from the second battery 22 to the first battery 12. The power transfer unit 42 can start the power transfer by turning ON the second relay device 52 connecting the second battery 22 to the second power supply system or turning ON the third relay device 53 and the switching DDC 60 connecting the first power supply system to the second power supply system. Simultaneously, the capacity estimation unit 43 starts a process of estimating the full charge capacity of the second battery 22 based on the amount of current discharged from the second battery 22 to the first battery 12, which is controlled by the switching DDC 60. Since the open circuit voltage or the transfer current can be accurately controlled by the switching DDC 60, it is possible to perform highly accurate estimation of the full charge capacity of the second battery 22 by applying a well-known current integration method to a discharging action from the high SOC to the low SOC.

(Step S607) When a determination is made in step S306 that the SOC of the second battery 22 is equal to or smaller than the fourth predetermined value (or the discharge current is equal to or smaller than the fifth predetermined value), the power transfer unit 42 ends the power transfer from the second battery 22 to the first battery 12. The power transfer unit 42 can end the power transfer by turning OFF the second relay device 52 connecting the second battery 22 to the second power supply system or turning OFF the third relay device 53 and the switching DDC 60 connecting the first power supply system to the second power supply system. Further, the capacity estimation unit 43 ends the process of estimating the full charge capacity of the second battery 22.

(Step S608) The capacity estimation unit 43 determines whether the estimation of the full charge capacity of the second battery 22 has been completed due to the performance of the power transfer. When the estimation of the full charge capacity is completed (Yes in S608), the process proceeds to step S609. When the estimation of the full charge capacity is not completed (No in S608), the process proceeds to step S611.

(Step S609) The power transfer unit 42 starts a process of charging the second battery 22 with the power of the first battery 12. This charging is performed in order to increase the SOC of the second battery 22 lowered due to power transfer. The amount of charge may be the amount of all transferred power or may be a part of the amount of power. The power transfer unit 42 can start the charging process by turning ON the second relay device 52 connecting the second battery 22 to the second power supply system or turning ON the third relay device 53 and the switching DDC 60 connecting the first power supply system to the second power supply system.

(Step S610) The determination unit 41 determines whether the SOC of the second battery 22 has become equal to or greater than a sixth predetermined value. This determination is made in order to determine whether sufficient amount of power has been returned to the second battery 22. Here, the sixth predetermined value, which is a sufficient amount of power, can be set to, for example, the amount of power (the state of charge) needed for backing up the functions related to the motion of the vehicle.

When the SOC of the second battery 22 becomes equal to or greater than the sixth predetermined value (Yes in S610), this process ends. When the SOC of the second battery 22 is not equal to or greater than the sixth predetermined value (No in S610), the process of step S610 is repeatedly executed.

(Step S611) When the power supply of the vehicle is turned ON next time (READY_ON, or the like), the determination unit 41 sets a flag for requesting performance of a process of estimating a predetermined full charge capacity to an ON state. The capacity estimation unit 43 confirms this flag when the power supply of the vehicle is turned ON, and when the flag is set to the ON state, the capacity estimation unit 43 performs a process of estimating the full charge capacity of the second battery 22 using the secured ΔSOC with high accuracy. When the capacity estimation unit 43 completes the process of estimating the full charge capacity of the second battery 22, the determination unit 41 sets the flag to the OFF state. The full charge capacity estimating process can be performed using a well-known current integration method in a charging action from a low SOC to a high SOC.

When the power supply of the vehicle is turned ON during the processes of steps S301 to S611 described above, the flag for requesting performance of the full charge capacity estimating process is OFF. Accordingly, the full charge capacity estimating process will not be performed. When the power supply of the vehicle is turned OFF next time, the process of step S301 described above is started again.

Third Embodiment

Configuration

A power supply control device 40 according to a third embodiment has the same configuration as the power supply control device applied to the power supply system 1 of the first embodiment illustrated in FIG. 1.

Control

Control that is executed by the power supply control device 40 according to the third embodiment of the present disclosure will be described with reference to FIG. 7. FIG. 7 is a flowchart illustrating a process related to estimation of a full charge capacity of the second battery 22 that is performed by the power supply control device 40 according to the third embodiment. In the flowchart illustrated in FIG. 7, a determination in step S701 is added to the flowchart of the first embodiment illustrated in FIG. 3. Since steps other than step S701 in FIG. 7 are the same as in the process described with reference to FIG. 3, description thereof will be omitted.

(Step S701) The determination unit 41 estimates a deteriorating state of the full charge capacity of the second battery 22 based on a temperature of the second battery 22, and determines whether there is a need to correct the current full charge capacity based on the estimated deteriorating state. More specifically, the determination unit 41 determines whether a ratio of a time in which the temperature of the second battery 22 becomes equal to or lower than a predetermined temperature to a time from the start of use of the second battery 22, which is obtained from predetermined battery temperature information, is equal to or smaller than a sixth predetermined value.

A battery made of a lithium ion battery, a lead battery, or the like has characteristics that deterioration of a battery progresses at a higher temperature more than at a low temperature. For example, FIG. 8 illustrates aged deterioration characteristics when batteries having the same state of charge (SOC) are left for a long period of time in an environment of temperatures 0° C., 10° C., 25° C., 45° C., 60° C., and 70° C. As illustrated in FIG. 8, a capacity retention rate of the batteries having the same state of charge deteriorates up to 93% after 240 days have elapsed when the battery is left for a long time without any charging in a state in which an environmental temperature of the battery is set to 0° C. (O plots). The capacity retention rate deteriorates up to 62% at a point in time at which 120 days have elapsed when the battery is left for a long time without any charging in a state in which an environmental temperature of the battery is set to 70° C. (X plots). Therefore, appropriate management of the environmental temperature is significant for the batteries.

Figures 9, 10, 11:
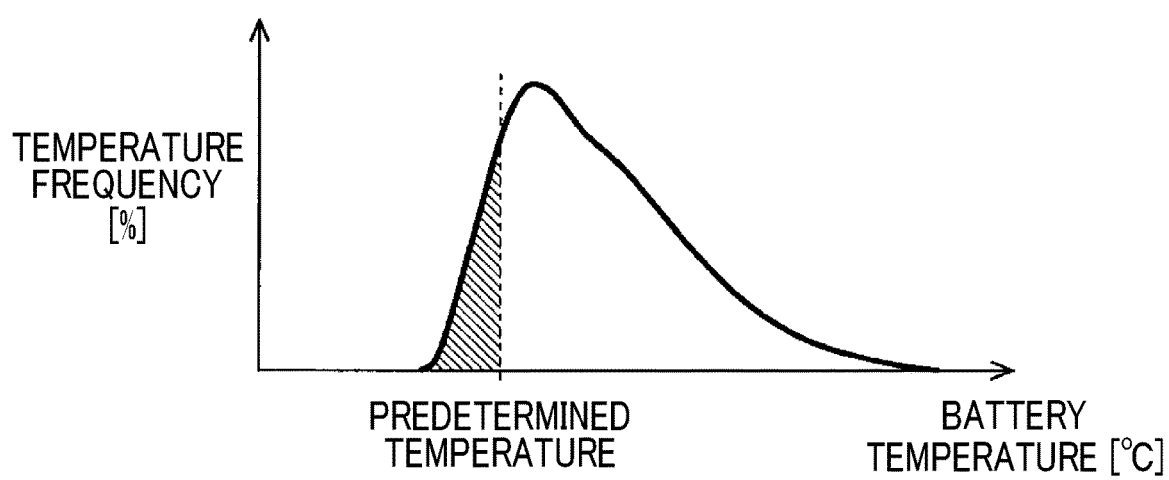
FIG. 9 is a table illustrating an example in which a presence time for each temperature of the battery has been calculated.
FIG. 10 is a table illustrating an example in which a presence frequency for each temperature of the battery has been calculated.
FIG. 11 is a graph illustrating a presence frequency of each temperature of the battery in FIG. 10.

When the determination in step S701 is performed, the determination unit 41 calculates a "presence time" by accumulating the time in which the batteries are in the states for each preset temperature division (B temperature: $Tb_1$ to $Tb_n$) as illustrated in FIG. 9 as the battery temperature information. The presence time may be solely a time in which the vehicle is used like traveling or may include a time in which the vehicle is not used like parking. The temperature division can be optionally set, like 1° C. units or 10° C. units. For example, the presence time in which the second battery 22 has been used at the temperature $Tb_3$ from the start of use of the vehicle to the present time is $t_3$, as illustrated in FIG. 9.

Next, the determination unit 41 divides the presence time at each temperature division illustrated in FIG. 9 by an elapsed time from the start of use of the vehicle to the present to calculate a presence frequency (=presence time/elapsed time) for each temperature division (B temperature: $Tb_1$ to $Tb_n$) as illustrated in FIG. 10 as the battery temperature information. For the elapsed time, the number of days calculated in step S302 can be used. The presence time and the presence frequency described above may be calculated each time step S701 is executed or may be calculated and stored sequentially during use of the vehicle. For example, the presence frequency at which the second battery 22 has been used at the temperature $Tb_3$ from the start of use of the vehicle to the present is $p_3$ (=$t_3$/elapsed time), as illustrated in FIG. 10. A distribution image of the presence frequencies (temperature frequencies) in the respective temperature divisions obtained in this manner is illustrated in FIG. 11.

The determination unit 41 determines whether the ratio of the time in which the temperature of the second battery 22 becomes equal to or lower than the predetermined temperature to the time from the start of use of the second battery 22 is equal to or smaller than the sixth predetermined value based on an obtained temperature frequency distribution. This determination is made to determine whether a time in which the second battery 22 is used at a low temperature is long or short. When the second battery 22 is used for a long time at a low temperature, it can be estimated that the progress of the battery deterioration is slow, and when the second battery 22 is not used for a long time at a low temperature, it can be estimated that the progress of the battery deterioration is fast. Therefore, for example, when an area of a shaded portion illustrated in FIG. 11 is smaller, a determination can be made that the battery is likely to deteriorate. The sixth predetermined value can be optionally set according to the capacity, characteristics, and the like of the second battery 22.

When the ratio of the time in which the temperature of the second battery 22 becomes equal to or lower than the predetermined temperature to the time from the start of use of the second battery 22 is equal to or smaller than the sixth predetermined value (Yes in S701), the process proceeds to step S304, and when the ratio of the time in which the temperature of the second battery 22 becomes equal to or lower than the predetermined temperature to the time from the start of use of the second battery 22 is not equal to or smaller than the sixth predetermined value (No in S701), the process ends.

Fourth Embodiment

Configuration

A power supply control device 40 according to a fourth embodiment has the same configuration as the power supply control device applied to the power supply system 2 of the second embodiment illustrated in FIG. 5.

Control

Figure 12:
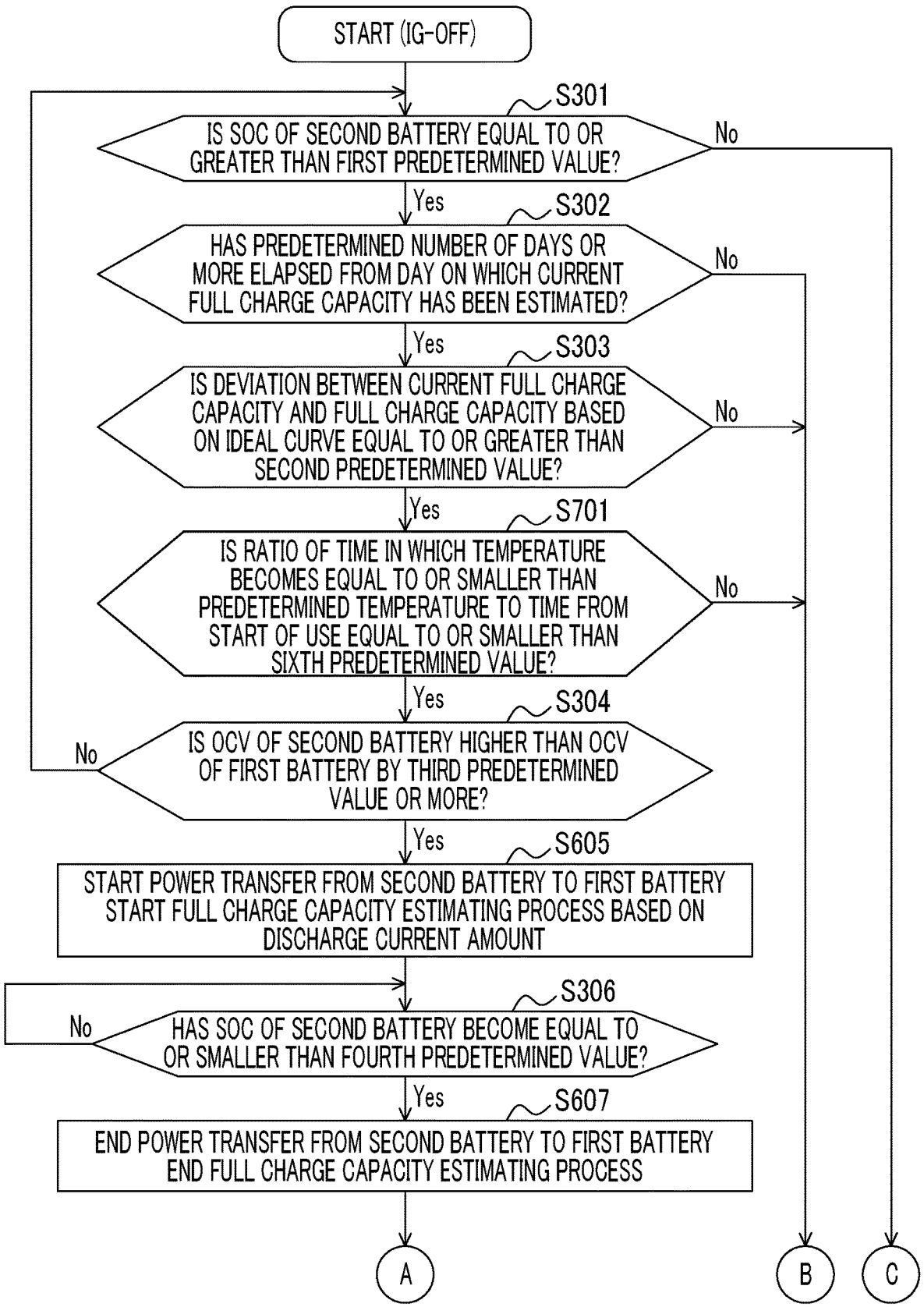
FIG. 12 is a flowchart illustrating a procedure of a process regarding estimation of a full charge capacity of a battery that is performed by a power supply control device according to a fourth embodiment.

FIG. 12 is a flowchart illustrating a part of a process related to estimation of a full charge capacity of the second battery 22 that is performed by the power supply control device 40 according to the fourth embodiment of the present disclosure. The flowchart illustrated in FIG. 12 is obtained by further adding the determination in step S701 described in the third embodiment to the flowchart of the second embodiment illustrated in FIG. 6A. In step S701, the determination unit 41 estimates a deteriorating state of the full charge capacity of the second battery 22 based on a temperature of the second battery 22, and determines whether there is a need to correct the current full charge capacity based on the estimated deteriorating state. More specifically, the determination unit 41 determines whether the ratio of the time in which the temperature of the second battery 22 becomes equal to or lower than a predetermined temperature to the time from the start of use of the second battery 22 is equal to or smaller than the sixth predetermined value.

Steps other than step S701 in FIG. 12 are the same as the processes described in FIG. 6A. Further, connectors A, B, and C of FIG. 12 are coupled to connectors A, B, and C of the flowchart of the second embodiment illustrated in FIG. 6B.

Modification Example

In the third and fourth embodiments, step S701 is added to steps S302 and 303 to determine whether there is a need to correct the currently estimated full charge capacity. In addition, solely in steps S302 and S701, a determination may be made as to whether there is a need to correct the currently estimated full charge capacity.

Operation and Effects

According to the power supply control device 40 according to the embodiment of the present disclosure described above, the power of the target battery (the second battery 22) in which there is a need to correct the full charge capacity because the state of charge is equal to or greater than a predetermined value (the first predetermined value) is transferred to another battery (the first battery 12) and lowered to a predetermined low SOC at a timing at which the power supply of the vehicle is turned OFF. Charging is performed with a wide SOC width from low SOC to high SOC at a timing at which the power supply of the vehicle is turned ON next time, and the full charge capacity of the target battery is calculated based on the current integration method. Accordingly, it is possible to perform a process of estimating the full charge capacity of the battery at a suitable timing. In particular, it is possible to suppress an influence of a measurement error of a current, a voltage, or the like in the sensor by securing a large ΔSOC, and to estimate the full charge capacity of the target battery with high accuracy.

Further, in the power supply control device 40 according to the embodiment, a determination is made as to whether there is a need to correct the full charge capacity based on whether a predetermined number of days has elapsed from a day on which the full charge capacity of the battery has last been estimated or based on a deteriorating state of the full charge capacity of the battery. The deteriorating state is estimated based on whether a deviation between a full charge capacity obtained from a predetermined aged deterioration curve and a full charge capacity estimated by the capacity estimation unit is equal to or greater than a predetermined value (the second predetermined value). By considering the deviation of the full charge capacity in this way, it is possible to accurately determine the necessity of correction of the full charge capacity. Further, the deteriorating state is estimated based on whether the ratio of a time in which a temperature of the battery becomes equal to or lower than a predetermined temperature to a time from start of use of the battery is equal to or smaller than a predetermined value (the sixth predetermined value). It is possible to more suitably determine the necessity of correction of the full charge capacity by considering the temperature of the battery in this way. With these determinations, it is possible to suppress power consumption needed for the full charge capacity estimating process, and it is possible to shorten a prohibition time of autonomous driving according to a decrease in the state of charge of the battery during the full charge capacity estimating process in a vehicle having an autonomous driving function.

Further, in the power supply control device 40 according to the embodiment, when the open circuit voltage of the target battery is higher than an open circuit voltage of a non-target battery by a predetermined value (the third predetermined value) or more, a predetermined power is transferred from the target battery to another battery. Accordingly, it is possible to avoid inefficient power transfer. Further, when the state of charge of the target battery becomes equal to or smaller than a predetermined value (the fourth predetermined value) or when the current value discharged from the target battery becomes equal to or smaller than a predetermined value (the fifth predetermined value), the power transfer ends. Accordingly, it is possible to avoid wasteful power transfer. Since the full charge capacity estimating process is performed without performing the power transfer for the battery of which the state of charge is smaller than the predetermined value (the first predetermined value), labor in the power transfer can be saved.

Further, in the power supply control device 40 according to the embodiment, it is also possible to estimate the full charge capacity of the second battery 22 with high accuracy by applying a well-known current integration method to an discharge action from high SOC to low SOC occurring when power is transferred from the second battery 22 to the first battery 12 as long as the first battery 12 and the second battery 22 are connected by the switching DDC 60 capable of controlling a current with high accuracy.

Although the embodiment of the present disclosure has been described above, the present disclosure can be ascertained as a power supply control device, a vehicle power supply system including the power supply control device, a method of estimating a full charge capacity that is executed by the power supply control device, a program of estimating a full charge capacity, a non-transient computer-readable recording medium storing the program, or a vehicle having the power supply control device mounted therein.

The power supply control device of the present disclosure can be used for, for example, a vehicle in which a power supply system including two power supply systems is mounted.

What is claimed is:

1. A power supply control device that estimates a full charge capacity of a battery mounted in a vehicle, the power supply control device comprising:
    a determination unit configured to determine whether there is a need to correct a currently estimated full charge capacity when a state of charge of the battery is equal to or greater than a first predetermined value at a timing at which a power supply of the vehicle is turned OFF;
    a power transfer unit configured to transfer a predetermined power from the battery to another battery when the determination unit determines that there is a need to correct the currently estimated full charge capacity; and
    a capacity estimation unit configured to perform a predetermined full charge capacity estimating process on the battery at a timing at which the power supply of the vehicle is turned ON after power transfer by the power transfer unit or during the power transfer by the power transfer unit.

2. The power supply control device according to claim 1, wherein
    the determination unit is configured to determine whether there is a need to correct the full charge capacity based on whether a predetermined number of days has elapsed from a day on which the full charge capacity of the battery has last been estimated by the capacity estimation unit.

3. The power supply control device according to claim 1, wherein
    the determination unit is configured to estimate a deteriorating state of the full charge capacity of the battery and is configured to determine whether there is a need to correct the full charge capacity based on the estimated deteriorating state.

4. The power supply control device according to claim 3, wherein
    the determination unit is configured to estimate the deteriorating state based on whether a deviation between a full charge capacity obtained from a predetermined aged deterioration curve and the full charge capacity estimated by the capacity estimation unit is equal to or greater than a second predetermined value.

5. The power supply control device according to claim 3, wherein
    the determination unit is configured to estimate the deteriorating state based on whether a ratio of a time, in which a temperature of the battery becomes equal to or lower than a predetermined temperature, to a time from start of use, which is obtained from predetermined battery temperature information, is equal to or smaller than a third predetermined value.

6. The power supply control device according to claim 1, wherein
    the power transfer unit is configured to transfer the predetermined power from the battery to the other battery when an open circuit voltage of the battery is higher than an open circuit voltage of the other battery by a fourth predetermined value or more.

7. The power supply control device according to claim 1, wherein
    the power transfer unit is configured to end the power transfer when the state of charge of the battery becomes equal to or smaller than a fifth predetermined value smaller than the first predetermined value or when a current value discharged from the battery becomes equal to or smaller than a sixth predetermined value.

8. The power supply control device according to claim 1, wherein the capacity estimation unit is configured to perform the full charge capacity estimating process at a timing at which the power supply of the vehicle is turned ON without the determination unit making the determination when the state of charge of the battery is smaller than the first predetermined value.

9. The power supply control device according to claim 1, wherein the power transfer unit is configured to perform a process of charging the battery with at least a part of the power transferred to the other battery when the estimation of the full charge capacity of the battery is completed due to power transfer.

\* \* \* \* \*